United States Patent [19]

Tamura et al.

[11] Patent Number: 5,264,731
[45] Date of Patent: Nov. 23, 1993

[54] METHOD FOR FABRICATING SEMICONDUCTOR DEVICE

[75] Inventors: Hideharu Tamura, Katano; Kazufumi Ogawa, Hirakata, both of Japan

[73] Assignee: Matsushita Electric Industrial Co., Ltd., Osaka, Japan

[21] Appl. No.: 922,667

[22] Filed: Aug. 5, 1992

Related U.S. Application Data

[63] Continuation of Ser. No. 764,071, Sep. 23, 1991, abandoned, which is a continuation of Ser. No. 548,186, Jul. 5, 1990, abandoned, which is a continuation of Ser. No. 210,840, Jun. 24, 1988, abandoned.

Foreign Application Priority Data

Jun. 25, 1987 [JP] Japan .................. 62-158225

[51] Int. Cl.$^5$ ............................. H01L 29/34
[52] U.S. Cl. ..................... 257/791; 257/632; 257/642
[58] Field of Search ................. 257/791, 632, 642

[56] References Cited

U.S. PATENT DOCUMENTS

| | | | |
|---|---|---|---|
| 4,199,649 | 4/1980 | Yundt | 428/411.1 X |
| 4,230,754 | 10/1980 | Maher et al. | 357/72 X |
| 4,377,619 | 3/1983 | Schonhorn et al. | 357/70 X |
| 4,673,474 | 6/1987 | Ogawa | 428/910 X |
| 4,696,838 | 9/1987 | Miyata et al. | 264/298 X |
| 4,751,100 | 6/1988 | Ogawa | 428/900 X |
| 4,751,171 | 6/1988 | Ogawa | 430/324 X |
| 4,761,316 | 8/1988 | Ogawa | 428/900 X |
| 4,824,766 | 4/1989 | Ogawa | 430/324 X |

OTHER PUBLICATIONS

Streetman, B., *Solid State Electronic Devices*, Prentice-Hall, 1972, pp. 377-379.

*Primary Examiner*—Sara W. Crane
*Attorney, Agent, or Firm*—Wenderoth, Lind & Ponack

[57] ABSTRACT

A method of fabricating a semiconductor device by (1) forming a semiconductor device having electrodes on the semiconductor substrate, (2) immersing the substrate into a solution which contains a silane group surface active agent so that a monomolecular film is formed an a surface of the substrate, and (3) molding the substrate having the monomolecular film by a synthetic resin. The monomolecular film functions as a protection film for protecting the semiconductor device.

4 Claims, 2 Drawing Sheets

METHOD FOR FABRICATING SEMICONDUCTOR DEVICE

This application is a continuation of now abandoned, application, Ser. No. 07/764,071, filed on Sep. 23, 1991, which is further a continuation application of Ser. No. 07/548,186, filed Jul. 5, 1990, which in turn is a continuation application of application Ser. No. 07/210,840, filed Jun. 24, 1988, all of the prior applications being abandoned.

BACKGROUND OF THE INVENTION

This invention relates to a method for fabricating a semiconductor device, and more particularly to a method for forming a protection film by use of a chemical reaction in the case that the protection film is formed after the aluminium electrode is formed.

In a conventional method for fabricating a semiconductor device, whether a semiconductor device is a bipolar device, an MOS device or the like, it is necessary to form a protection film (e.g., made of phosphor glass, silicon nitride film) for protecting the semiconductor device from water, alkali metal or physical shock etc. after the aluminium electrodes are formed.

For example, in the case of fabricating ICs of a bipolar structure, a PSG (Phosphor-Silicate Glass) film is formed in approximately 3000 Å thickness under a condition of normal pressure and thereafter, plasma Si—N film (silicon nitride film) is formed in approximately 5000 Å thickness under the condition of reduced pressure. These PSG and plasma Si—N films function as protection films.

Such a conventional method for forming a protection film is carried out by use of CVD apparatus, a plasma apparatus etc. by controlling temperature and pressure. Therefore, the throughput of wafers largely depends upon the performance of the apparatus.

Further, as to a plasma $Si_3N_4$ film, since its expansion rate is much higher than that of $SiO_2$, stress migration occurs to Al electrodes and wiring so that the electrical performance of a semiconductor device is sometimes aggravated.

SUMMARY OF THE INVENTION

This invention, therefore, provides a method for fabricating a semiconductor device which can resolve the drawbacks stated above.

More particularly, this invention provides a method, for fabricating a semiconductor device in which a monomolecular adsorption film of a silane group or a fluorosilane group is formed on a surface, of a semiconductor device as a protection film after an electrode of Al etc. is formed on the substrate.

According to this method, it is possible to form a protection film of very thin, thickness of monomolecule level, by use of very simple apparatus, i.e., by simply immersing the device into a solution.

While the novel features of the invention are set forth with particularity in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1A:
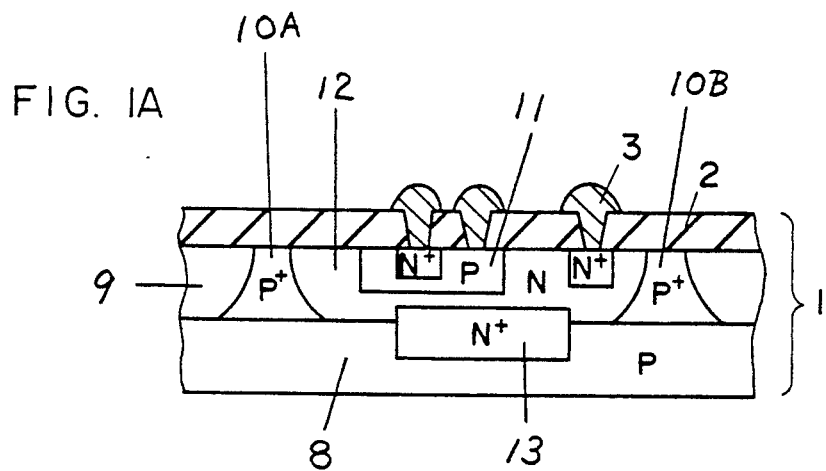
FIGS. 1A–1D shows one example of a method for fabricating a semiconductor device of the invention.

Referring to the drawing and first to FIG. 1A, there is illustrated a substrate of a bipolar IC in which Al electrodes 3 are already formed by use of a conventional process technique. On an upper surface of the substrate 1, an $SiO_2$ film 2 and Al electrodes 3 (which may contain Si) are formed in a pattern manner.

Figure 1B:
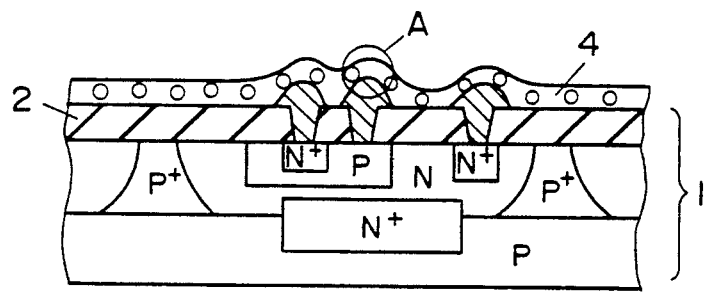

Then, as shown in FIG. 1B, a monomolecular film 4 is formed on an entire surface (at least the upper surface as shown in FIG. 1B) of the substrate 1 as a protection film for covering an entire surface of the substrate and for protecting the IC electrically and physically. The monomolecular film 4 is formed as follows. A silane surface active agent (e.g., $CH_2=CH-(CH_2)_n-SiCl_3$, n: integer, preferably and wherein, $CH_2=CH$ may be replaced by $CH\equiv C\longrightarrow$ is treated on the surface of the substrate 1 to thereby by adsorped thereon by use of chemical adsorption method, so that

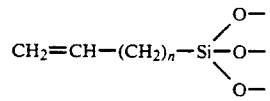

(n: integer) monomolecular film 4 is formed on the surface of the substrate 1.

More particularly, the substrate 1 is immersed in a solution of 80% n-cetane, 12% carbon tetrachloride and 8% chloroform with concentration of $2.0\times10^{-3}-5.0\times10^{-2}$ mol/l of the silane surface active agent of $CH_2=CH-(CH_2)_n-SiCl_3$ so that bondings 5 of

Figure 1C:
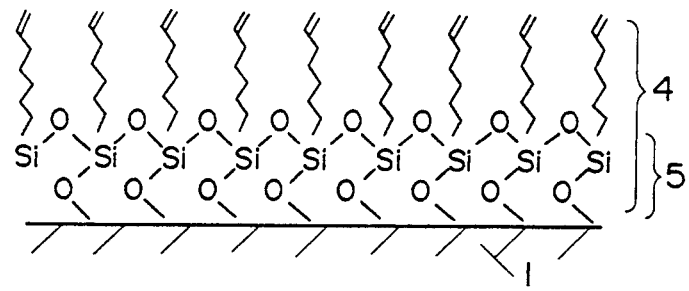

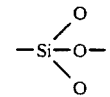

are formed on the surface of the substrate 1 as shown in FIG. 1C. In this case, each molecule of the silane surface active agent is disposed in high density from the viewpoint of a molecular level on the surface of the substrate 1. The monomolecular film is of very high hydrophobic characteristics. Therefore, as shown in FIG. 1D, the surface of the substrate 1 including the film 4 represents very high hydrophobic characteristic against water molecules 6 coming from outside.

Figure 1D:
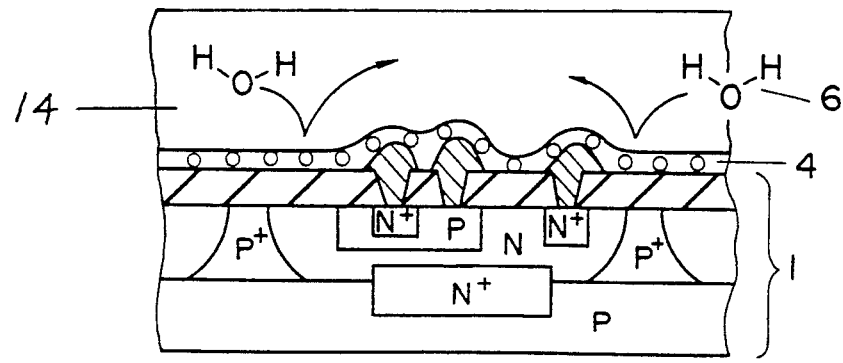

Right after the formation of said monomolecular film 4, the entire substrate 1 is molded by a synthetic resin 14 (e.g., epoxy resin) as shown in FIG. 1D.

Incidentally, the substrate 1 is of the structure that as shown in FIG. 1A, N-type layer 8 is formed on a P-type substrate 9, and P+ isolation regions 10A, 10B are formed in the N-type layer 9, and an active device of an npn type bipolar transistor 11 is formed in an island region 12 which is formed between said p+ isolation region 10A, 10B, and N+ buried region 13 is disposed at boundary of the P-type substrate 8 and N-type layer 9 below the bipolar transistor 11.

In case that $CH_2=C-(CH_2)_n-SiCl_3$(n: integer) is used as the silane surface active agent, the monomolecular film 4 is

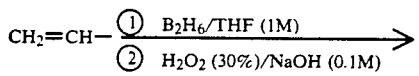

(n: integer).

Incidentally, it is possible to form a multi-monomolecular film by oxidizing the $H_2C=CH-$ group and repeating the above chemical adsorption method.

That is, in case that $CH_2=CH-(CH_2)_n-SiCl_3$ is used, the monomolecular film, after it is adsorbed is reacted with the THF solution of diborane and alkali peroxide aqueous solution so that the following oxidation reaction occurs.

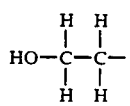

Thus, after the —OH group is formed on a surface of the monomolecular film (1st layer), the adsorption reaction is repeated so that 2nd layer of the monomolecular film is formed on the first layer. This forms a two layer-monomolecular film.

In the case that a monomolecular film of more than three layers is formed, a monomolecular film of arbitrary number of layers can be formed by repeating the oxidation reaction and adsorption reaction.

Further, it is also possible to carry out the above stated reaction when $CH\equiv C-(CH_2)_nSiCl_3$ is used, In this case, the following reaction occurs:

By this reaction, an —OH group can be formed. Incidentally, in the case that an unsaturated group such as $H_2C=CH-$group $HC\equiv C-$group remains at the ends of the monomolecular film, the =group largely improves the close adherence between the monomolecular film and the molding resin.

A second example will be explained in reference to FIGS. 2A, 2B. In this example, a fluoro-silane surface active agent is used instead of a silane surface active, agent explained in the first example. Other processes are the same as in the first example explained with reference to FIGS. 1A–1D. The fluoro-silane surface active agent, for example,

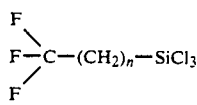

(n: integer, preferably (0–30). By use of the fluorosilane surface active agent, a monomolecular film 4A of

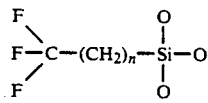

Figure 2A:
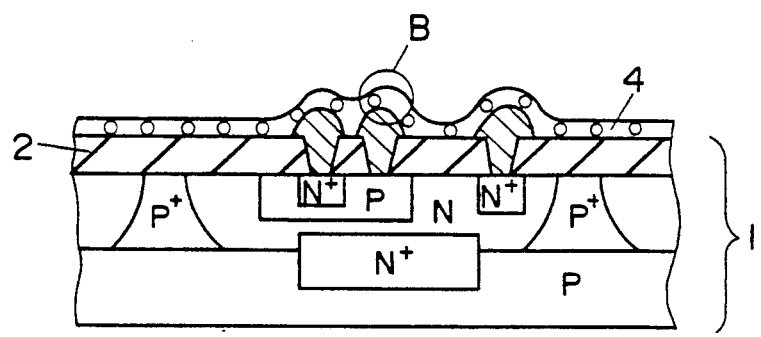
FIGS. 2A, 2B shows another example of the method of the invention.
Figure 2B:
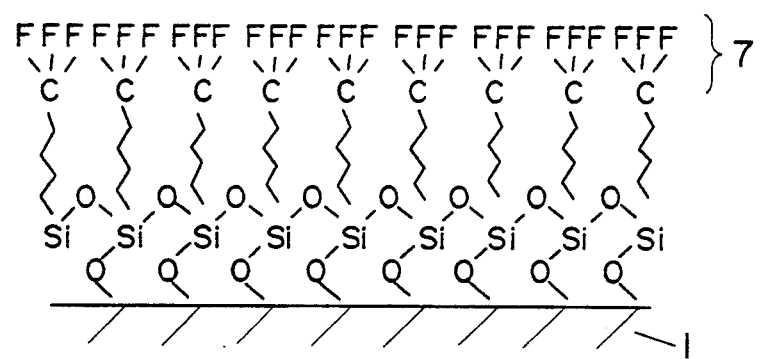

(n: integer) is formed on the surface of the substrate as shown in FIG. 2A. As shown in FIG. 2B, bondings 6 of

are disposed in high density on the surface of the device 1. Generally, the $-CF_3$ group has higher hydrophobic characteristics than a hydrocarbon radical and higher durability of the entire molecule. Therefore, the surface of the substrate 1, including the film 4A, has very high hydrophobic characteristics to the outside and also high durability.

Incidentally, in the above examples, methods for forming a single monomolecular film or multi-monomolecular film right after the formation of an Al wiring are explained, but it is of course possible to carry out the method of the invention after a PSG film, an $SiO_2$ film or an $Si_3N_4$ film as a passivation film is formed.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

We claim:

1. A semiconductor device consisting essentially of a substrate having active semiconductive element(s) thereupon, on which an $SiO_2$ film and Al electrodes are formed, wherein the entire surface of said device is covered with a protective monomolecular or multi-monomolecular film having $-CF_3$ groups at the outermost surface and straight chain hydrocarbon groups and being covalently bonded to said semiconductor device via

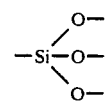

groups, said device molded by a synthetic resin covered over said protective film.

2. A semiconductor device according to claim 1 in which the active semiconductor element(s) covered with the protective film is a bipolar transistor formed on the substrate of the semiconductor device.

3. The device of claim 1 wherein said protective monomolecular or the top layer of said multi-monomolecular film is composed of a material which contains a fluorocarbon group of the general formula:

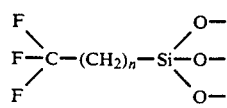

wherein n is an integer.

4. The device of claim 3 wherein n is an integer of 10 to 30.

* * * * *